United States Patent
Jung

(10) Patent No.: US 11,855,665 B2
(45) Date of Patent: Dec. 26, 2023

(54) PASSIVE MIXER INCLUDING LLC FILTER AND RF TRANSMITTING CIRCUIT INCLUDING PASSIVE MIXER

(71) Applicant: Samsung Electronics Co., Ltd., Suwon-si (KR)

(72) Inventor: Wonjun Jung, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/749,399

(22) Filed: May 20, 2022

(65) Prior Publication Data

US 2022/0376715 A1 Nov. 24, 2022

(30) Foreign Application Priority Data

May 21, 2021 (KR) .................. 10-2021-0065648

(51) Int. Cl.
  *H04B 1/04* (2006.01)
  *H04B 1/00* (2006.01)

(52) U.S. Cl.
  CPC ............ *H04B 1/04* (2013.01); *H04B 1/0057* (2013.01); *H04B 2001/0425* (2013.01); *H04B 2001/0491* (2013.01)

(58) Field of Classification Search
  CPC ..... H03F 1/56; H03F 3/19; H03F 3/68; H03F 3/189; H03F 3/213; H03H 7/01; H03H 7/38; H04B 1/00; H04B 1/04; H04B 1/06; H04B 1/16; H04B 1/40; H04B 1/0057; H04B 7/00; H04B 7/26; H04B 2001/0491; H04B 2001/0425; H04M 1/02

USPC ........... 333/32, 172, 176; 375/219, 295–297, 375/333, 350; 455/120, 323, 334
  See application file for complete search history.

(56) References Cited

U.S. PATENT DOCUMENTS

| | | | |
|---|---|---|---|
| 4,449,245 A | 5/1984 | Rabe | |
| 7,209,188 B2 | 4/2007 | Kawamura | |
| 7,519,348 B2 | 4/2009 | Shah | |
| 8,494,473 B2 | 7/2013 | Ozgun et al. | |
| 9,263,990 B2 | 2/2016 | Goldblatt | |

(Continued)

FOREIGN PATENT DOCUMENTS

KR 102161154 B1 9/2020

OTHER PUBLICATIONS

European Search Report dated Oct. 24, 2022 for corresponding EP Patent Application No. 22174499.8.

*Primary Examiner* — Shawkat M Ali
(74) *Attorney, Agent, or Firm* — Harness, Dickey & Pierce, P.L.C.

(57) ABSTRACT

Disclosed is a transmission radio frequency (RF) circuit including a transmission mixer configured to receive an intermediate frequency (IF) signal and up-convert the IF signal into an RF signal, a driving amplifier configured to amplify the RF signal, and an LLC filter electrically connected to a differential output of the transmission mixer and a differential input of the driving amplifier, the LLC filter comprising a first inductor connecting a first node of the differential output of the transmission mixer to a first intermediate node, a second inductor connecting a second node of the differential output of the transmission mixer to a second intermediate node, a third inductor connecting the first intermediate node to the second intermediate node, and a capacitor in parallel with the third inductor.

20 Claims, 10 Drawing Sheets

(56) References Cited

U.S. PATENT DOCUMENTS

| | | |
|---|---|---|
| 9,444,498 B2 | 9/2016 | Magoon et al. |
| 9,680,444 B2 | 6/2017 | Nishimura |
| 9,960,795 B1 | 5/2018 | Liu et al. |
| 2005/0064840 A1 | 3/2005 | Heydari et al. |
| 2009/0121844 A1* | 5/2009 | Repke ................. H04Q 9/00 340/10.42 |
| 2014/0347117 A1 | 11/2014 | Goldblatt |
| 2015/0078464 A1* | 3/2015 | Kaunisto ............ H03H 7/0115 333/175 |
| 2020/0127605 A1 | 4/2020 | Vida et al. |
| 2021/0184633 A1* | 6/2021 | Khlat ................. H03F 1/0288 |

* cited by examiner

PASSIVE MIXER INCLUDING LLC FILTER AND RF TRANSMITTING CIRCUIT INCLUDING PASSIVE MIXER

CROSS-REFERENCE TO RELATED APPLICATION

This application is based on and claims priority under 35 U.S.C. § 119 to Korean Patent Application No. 10-2021-0065648, filed on May 21, 2021, in the Korean Intellectual Property Office, the disclosure of which is incorporated by reference herein in its entirety.

BACKGROUND

The inventive concepts relate to passive mixer circuits, and more particularly, to a passive mixer including an LLC filter.

Efforts are being made to develop an improved 5th generation (5G) communication system or pre-5G communication system in order to meet the increasing demand for wireless data traffic after commercialization of the 4th generation (4G) communication system. For this reason, a 5G communication system, or a pre-5G communication system, is referred to as a post-4G network (Beyond 4G Network) communication system or a post-Long Term Evolution (LTE) system (Post LTE) system.

In order to achieve a high data transmission rate, the implementation of 5G communication systems in millimeter wave (mmW) frequency bands (e.g., 60 GHz bands) has been considered. In order to alleviate a path loss of waves in an ultra-high frequency band and increase a propagation distance of the waves, beamforming, massive MIMO, full dimensional MIMO (FD-MIMO), array antenna, analog beamforming, digital beamforming, hybrid beamforming, and large scale antenna technologies have been considered for use in 5G communication systems.

In radio frequency integrated circuit (RFIC) transceiving circuits, as the size of a process becomes smaller, power available for a device decreases and high transmit power is used for 5G in a high frequency band. Thus, it is difficult to obtain high current consumption and high linearity in the case of existing active mixer structures.

In order to address this challenge, a passive mixer structure including only passive devices has been employed. However, in order to address the low linearity challenge of a voltage mixer and also support a wide bandwidth, it would be desirable to increase the output impedance of the passive mixer and provide the output impedance as a resistive impedance without a reactance component.

SUMMARY

The inventive concepts provide a radio frequency (RF) chain that improves (e.g., reduces) power consumption caused by a low $3^{rd}$ harmonic frequency rejection ratio and a lower impedance of the RF chain, and has a smaller size in a higher frequency band.

According to an aspect of the inventive concepts, there is provided a transmission RF circuit including a transmission mixer configured to receive an intermediate frequency (IF) signal and up-convert the IF signal into an RF signal, a driving amplifier configured to amplify the RF signal, and an LLC filter electrically connected to a differential output of the transmission mixer and a differential input of the driving amplifier, the LLC filter comprising a first inductor connecting a first node of the differential output of the transmission mixer to a first intermediate node, a second inductor connecting a second node of the differential output of the transmission mixer to a second intermediate node, a third inductor connecting the first intermediate node to the second intermediate node, and a capacitor in parallel with the third inductor.

According to an aspect of the inventive concepts, there is provided an LLC filter including a first inductor connecting a first node of a differential output end of an RF mixer to a first intermediate node, a second inductor connecting a second node of the differential output end of the RF mixer to a second intermediate node, a third inductor connecting the first intermediate node to the second intermediate node, and a middle of the third inductor being connected to ground; and a capacitor in parallel with the third inductor.

According to an aspect of the inventive concepts, there is provided an electronic device including a controller, and a communication interface comprising a converter configured to convert a baseband signal into an analog signal, a first mixer configured to convert the analog signal into an intermediate frequency (IF) signal based on a first oscillation frequency, a second mixer configured to convert the IF signal into a radio frequency (RF) signal based on a second oscillation frequency to obtain an output signal, an RF filter configured to filter the output signal to obtain a filtered output signal, and a driving amplifier configured to amplify the filtered output signal, wherein the RF filter comprises a first inductor connecting a first node of a differential output end of the second mixer to a first intermediate node, a second inductor connecting a second node of the differential output end of the second mixer to a second intermediate node, a third inductor connecting the first intermediate node to the second intermediate node, and a capacitor in parallel with the third inductor.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Embodiments of the inventive concepts will now be described more fully with reference to the accompanying drawings.

Figure 1:
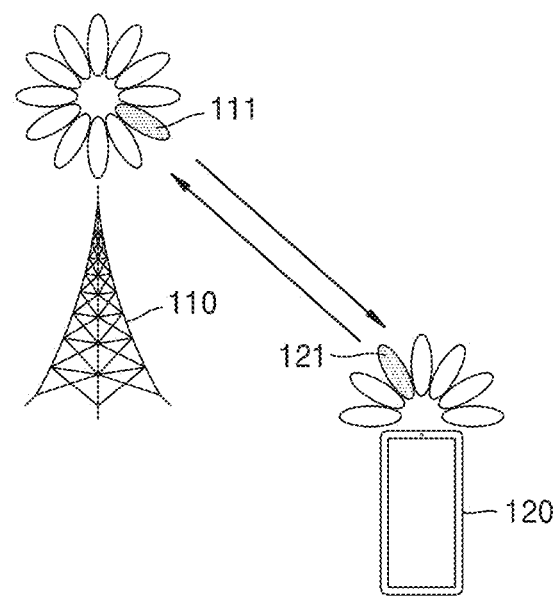
FIG. 1 is a view of a wireless communication system according to embodiments of the inventive concepts.

FIG. 1 is a view of a wireless communication system according to embodiments of the inventive concepts.

Referring to FIG. 1, a base station 110 and an electronic device 120 are disclosed. The base station 110 and the electronic device 120 may be illustrated as nodes that use a wireless channel in the wireless communication system.

According to embodiments, the base station 110 is part of a network infrastructure and provides a wireless connection to the electronic device 120. The base station 110 may have a coverage that is defined as a certain geographic area based on a distance in which the base station 110 is capable of transmitting a signal. The base station 110 may also be referred to as 'an access point (AP)', 'an eNodeB (eNB)', 'a 5th generation (5G) node', 'a wireless point', and/or other terms having an equivalent technical meaning.

According to embodiments, the base station 110 may be connected to one or more transmission/reception points (TRPs). The base station 110 may transmit a downlink signal to the electronic device 120 and/or receive an uplink signal, through the one or more TRPs. According to embodiments, the base station 110 and the electronic device 120 may communicate over a wireless communication system using a cellular network such as fifth generation (5G), long term evolution (LTE), LTE-Advanced, new radio (NR), wireless broadband (WiBro), or a global system for mobile communication (GSM), or included in a wireless local area network (WLAN) system, a wireless fidelity (WiFi) system, a Bluetooth communication system, and/or another wireless communication system. According to embodiments, the base station 110 and the electronic device 120 may communicate according to orthogonal frequency-division multiplexing (OFDM), orthogonal frequency-division multiple access (OFDMA) based wireless communication systems, code division multiple access (CDMA), etc.

The electronic device 120, which is a device used by a user, may perform communication with the base station 110 through a wireless channel. The electronic device 120 may be referred to as 'a terminal', 'a user equipment (UE)', 'a mobile station', 'a subscriber station', 'a customer premises equipment (CPE)', 'a remote terminal', 'a wireless terminal', 'a user device', and/or other terms having an equivalent technical meaning.

The base station 110 and the electronic device 120 may transmit and/or receive a wireless signal in a millimeter wave (mmWave) band (e.g., 28 GHz, 30 GHz, 38 GHz, and/or 60 GHz). To overcome attenuation of the mmWave signal, the base station 110 and the electronic device 120 may perform beamforming. The beamforming may include transmission beamforming and/or reception beamforming. In other words, the base station 110 and/or the electronic device 120 may assign directivity to a transmission signal and/or a reception signal. To this end, the base station 110 and/or the electronic device 120 may select optimal (or effective) beams 111 and/or 121 (e.g., a transmission beam and/or a reception beam, respectively) for wireless communication through a beam search, beam training, and/or beam management procedure.

Figure 2:
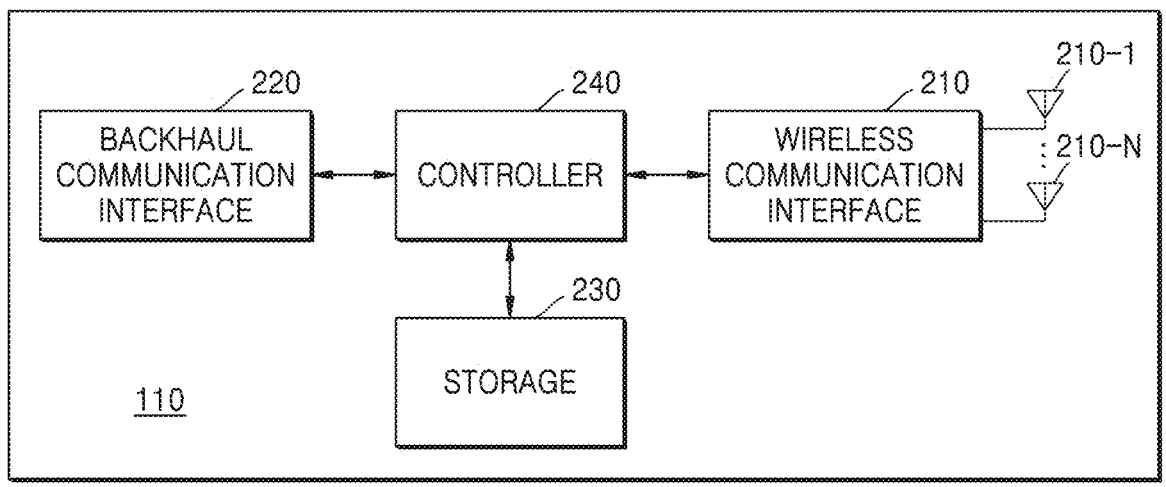
FIG. 2 is a block diagram of a base station according to embodiments of the inventive concepts.

FIG. 2 is a block diagram of a base station according to embodiments of the inventive concepts.

Referring to FIG. 2, the base station 110 may include a wireless communication interface 210, a backhaul communication interface 220, a storage 230, and/or a controller 240.

According to embodiments, the wireless communication interface 210 may perform functions for transmitting and/or receiving a signal through a wireless channel. According to embodiments, the wireless communication interface 210 may perform a conversion between a baseband signal and a bitstring according to a physical layer standard of a system. For example, during data transmission, the wireless communication interface 210 may generate complex symbols by encoding and modulating a transmission bitstring, and, during data reception, the wireless communication interface 210 may restore a reception bitstring by demodulating and decoding the baseband signal. The wireless communication interface 210 may up-convert the baseband signal into a radio frequency (RF) band signal and then transmit the RF band signal through an antenna, or may down-convert an RF band signal received through the antenna into a baseband signal. To this end, the wireless communication interface 210 may include a transmission filter, a reception filter, an amplifier, a mixer, an oscillator, a digital to analog converter (DAC), an analog to digital converter (ADC), and/or the like.

According to embodiments, the wireless communication interface 210 may transmit and/or receive a signal. For example, the wireless communication interface 210 may transmit a synchronization signal, a reference signal, system information, a message, control information, and/or data. The wireless communication interface 210 may perform beamforming. The wireless communication interface 210 may apply a beamforming weight to a signal desired to be transmitted and/or received, in order to assign directivity to the signal. The wireless communication interface 210 may repeatedly transmit the signal by changing a beam that is formed. According to embodiments, the base station 110 may include a plurality of antennas. The plurality of antennas 210-1 through 210-N may include array antennas.

According to embodiments, the backhaul communication interface 220 provides an interface for performing communication with other nodes within a network. In other words, the backhaul communication interface 220 may convert a bitstring that is transmitted from the base station 110 to another node, for example, another connection node, another base station, an upper node, or a core network, into a physical signal, and may convert a physical signal received from the other node into a bitstring.

According to embodiments, the storage 230 stores data such as a basic program, an application program, and/or configuration data for an operation of the base station 110. The storage 230 may be configured with volatile memory, nonvolatile memory, and/or a combination of volatile memory and nonvolatile memory. The controller 240 controls operations of the base station 110. For example, the controller 240 transmits and/or receives a signal through the wireless communication interface 210 and/or the backhaul communication interface 220. The controller 240 writes and reads data to and from the storage 230. To this end, the controller 240 may include at least one processor.

Figure 3:
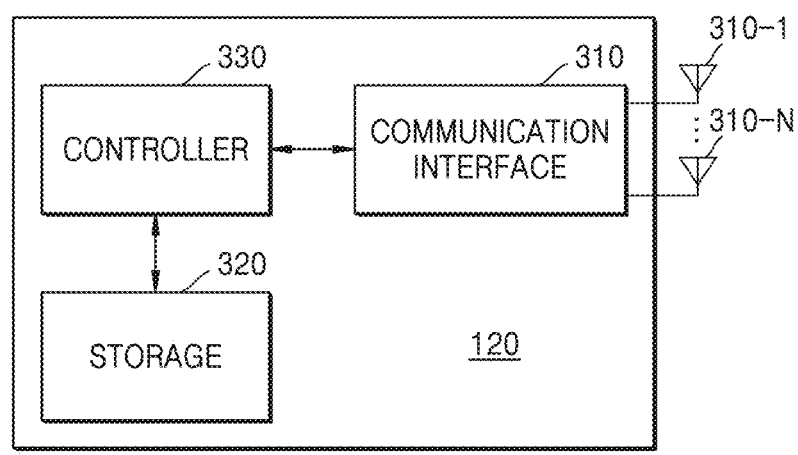
FIG. 3 is a block diagram of an electronic device according to embodiments of the inventive concepts.

FIG. 3 is a block diagram of an electronic device according to embodiments of the inventive concepts.

Referring to FIG. 3, the electronic device 120 may include a communication interface 310, a storage 320, and/or a controller 330.

The communication interface 310 performs functions for transmitting and/or receiving a signal through a wireless channel. For example, the communication interface 310 performs a conversion between a baseband signal and a bitstring according to the physical layer standard of a system. For example, during data transmission, the communication interface 310 may generate complex symbols by encoding and modulating a transmission bitstring, and, during data reception, the communication interface 310 may restore a reception bitstring by demodulating and decoding a baseband signal. The communication interface 310 may up-convert the baseband signal into an RF band signal and then transmit the RF band signal through an antenna, or may down-convert an RF band signal received through the antenna into a baseband signal. For example, the communication interface 310 may include a transmission filter, a reception filter, an amplifier, a mixer, an oscillator, a DAC, an ADC, and/or the like. The communication interface 310 may perform beamforming. The communication interface 310 may apply a beamforming weight to a signal desired to be transmitted and/or received, in order to assign directivity to the signal. According to embodiments, the electronic device 120 may include a plurality of panel antennas. The plurality of panel antennas 310-1 through 310-N may include array antennas, and may be arranged at locations (e.g., arbitrary locations) on the electronic device 120.

The communication interface 310 may transmit and/or receive a signal. The communication interface 310 may receive a downlink signal. The downlink signal may include a synchronization signal (SS), a reference signal RS, system information, a configuration message, control information, and/or downlink data. The communication interface 310 may transmit an uplink signal. The uplink signal may include a random access related signal, a reference signal (e.g., a sounding reference signal (SRS), demodulation reference signal (DM-RS), etc.), and/or uplink data.

The storage 320 may store data such as a basic program, an application program, and/or configuration data for an operation of the electronic device 120. The storage 320 may be configured with volatile memory, nonvolatile memory, and/or a combination of volatile memory and nonvolatile memory. The storage 320 may provide stored data according to a request of the controller 330. According to embodiments, the storage 320 may include a codebook storage for storing information about a plurality of codebooks. The codebook storage may store information such as a beamforming weight that at least one panel antenna selected for wireless communication from among the plurality of panel antennas uses to perform optimal (or effective) beamforming.

The controller 330 controls overall operations of the electronic device 120. For example, the controller 330 may transmit and/or receive a signal through the communication interface 310. The controller 330 may write and read data to and from the storage 320. To this end, the controller 330 may include at least one processor or micro-processor, or may be a portion of a processor. When the controller 330 is a portion of a processor, the controller 330 and a portion of the communication interface 310 may be referred to as a communication processor (CP).

Figure 4:
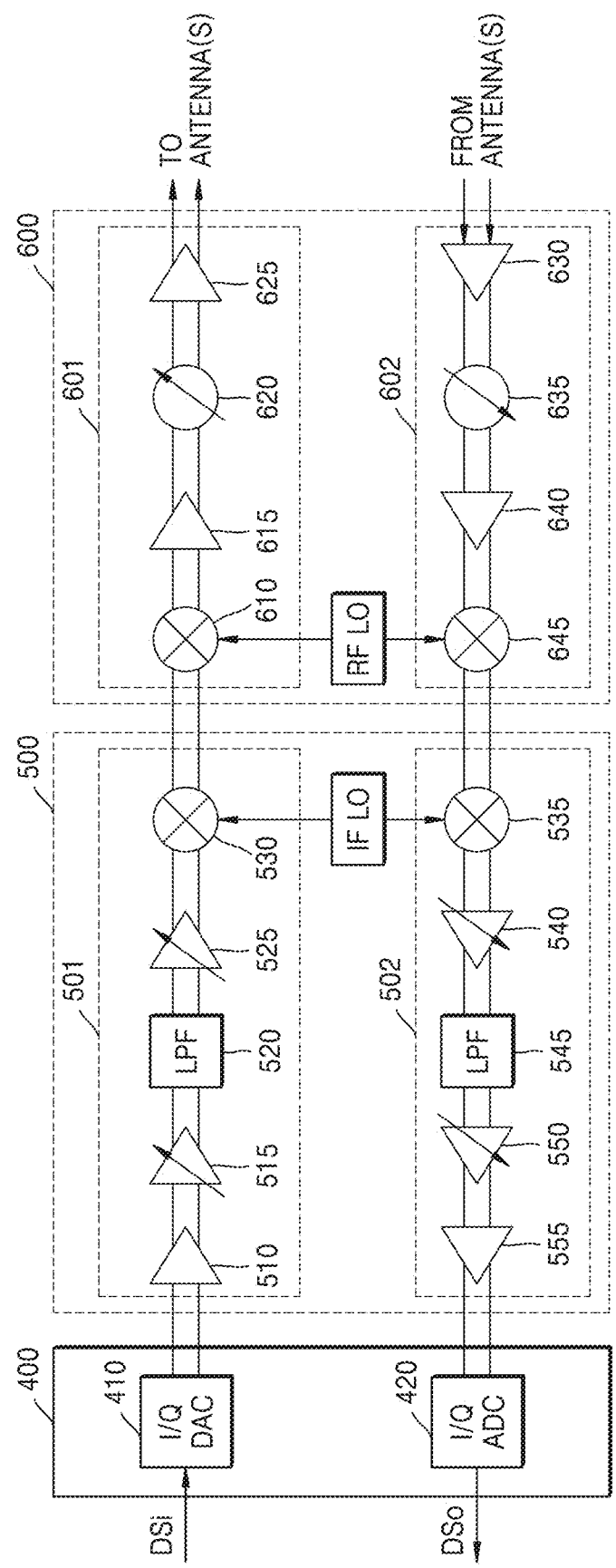
FIG. 4 is a block diagram of a transmission radio frequency (RF) chain according to embodiments of the inventive concepts.

FIG. 4 is a block diagram of a transmission RF chain according to embodiments of the inventive concepts.

Referring to FIG. 4, a communication interface (for example, the wireless communication interface 210 of FIG. 2 or the communication interface 310 of FIG. 3) may include an RF IC 600, an intermediate frequency (IF) IC 500, and/or a communication processor 400. According to embodiments, a variety of components may be added to or be omitted from the communication system.

According to embodiments, the communication processor 400 may include a transmission in phase (I)/quadrature phase (Q) DAC 410 and a reception I/Q ADC 420. The transmission I/Q DAC 410 may convert a digital signal (e.g., a digital signal $DS_i$) modulated by a modem (e.g., a modem implemented by the controller 240 or the controller 330) into a balanced I signal and a balanced Q signal, and may transmit the balanced I signal and the balanced Q signal to the IF IC 500. The reception I/Q DAC 420 may convert a balanced I signal and a balanced Q signal converted by the IF IC 500 into a digital signal (e.g., a digital signal DSO, and may transmit the digital signal to the modem. According to embodiments, the communication processor 400 may be implemented using a special chip, or may be implemented to be integrated with another component (for example, the IF IC 500) into a single chip.

According to embodiments, the IF IC 500 may include a transmission IF chain 501 and a reception IF chain 502. The transmission IF chain 501 may include a transmission IF buffer 510, a first transmission variable gain amplifier (VGA) 515, a low pass filter (LPF) 520, a second transmission VGA 525, and/or a transmission IF mixer 530.

When the transmission IF buffer 510 receives the balanced I signal and the balanced Q signal from the communication processor 400, the transmission IF buffer 510 may perform a buffering role, and thus the IF IC 500 may stably process the balanced I signal and the balanced Q signal. The LPF 520 may filter a signal (e.g., the balanced I signal and the balanced Q signal) by using the bandwidth of the baseband signal as a cutoff frequency. The cutoff frequency may be variable. The first transmission VGA 515 and the second transmission VGA 525 may receive a control signal from the communication processor 400 and perform transmission auto gain control (AGC). In the present example, the number of VGAs is two. However, embodiments of the inventive concepts are not limited thereto. The transmission IF mixer 510 may receive a frequency signal corresponding to an IF signal band from a local oscillator (LO), and may convert a balanced I signal and a balanced Q signal corresponding to a baseband into an IF signal, based on the frequency signal.

The reception IF chain 502 may include a reception IF buffer 555, a first reception VGA 550, an LPF 545, a second reception VGA 540, and/or a reception IF mixer 535, and may respectively play the same role as, or similar roles to, the roles of the transmission IF buffer 510, the first transmission VGA 515, the LPF 520, the second transmission VGA 525, and/or the transmission IF mixer 530 included in the transmission IF chain 501.

According to embodiments, the RF IC 600 may include a transmission RF chain 601 (may also be referred to herein as a transmission RF circuit) and a reception RF chain 602. The transmission RF chain 601 may include a transmission RF mixer 610, a transmission driving amplifier (DA) 615, a phase shifter 620, and/or a transmission power amplifier (PA) 625.

The transmission RF mixer 610 may receive the IF signal from the IF IC 500, and may up-convert the IF signal into an RF signal, based on a frequency signal received from an LO. The transmission DA 615 may amplify the RF signal obtained by the transmission RF mixer 610 through the up-conversion. The phase shifter 620 may change the phase of the RF signal according to a beamforming angle, based on the control signal received from the communication processor 400. The transmission PA 625 may amplify power when the RF signal is transmitted. The transmission PA 625 may be embedded outside or inside the RF IC 600. The transmission RF mixer 610 may be connected to the transmission DA 615 through one or more filters.

The reception RF chain 602 may include a reception RF mixer 645, a reception DA 640, a phase shifter 635, and/or a reception PA 630, and may respectively play the same role as, or similar roles to, the roles of the transmission RF mixer 610, the transmission DA 615, the phase shifter 620, and/or the transmission PA 625 included in the transmission RF chain 601. According to embodiments, the transmission RF chain 601 may output one or more transmission signals to one or more antennas, and/or the reception RF chain 602 may receive one or more reception signals from the one or more antennas.

In the above-described example, a single transmission path including the transmission IF chain 501 and the transmission RF chain 601, and a single reception path including the reception RF chain 602 and the reception IF chain 502, are illustrated. However, embodiments of the inventive concepts are not limited thereto.

Figure 5:
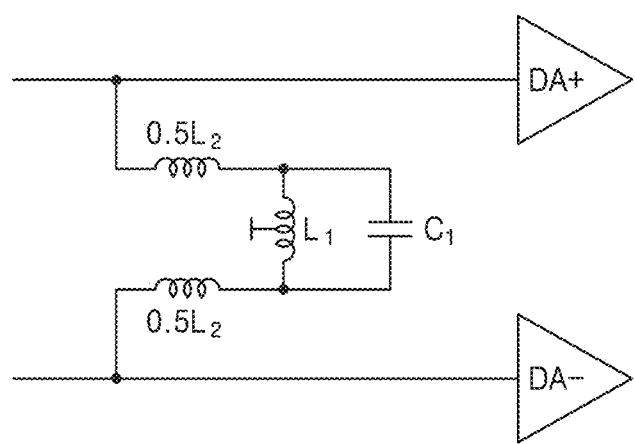
FIG. 5 is a circuit diagram of a passive mixer circuit according to embodiments of the inventive concepts.

FIG. 5 is a circuit diagram of a passive mixer circuit according to embodiments of the inventive concepts.

Referring to FIG. 5, the transmission RF chain 601 including a passive mixer circuit (e.g., an LLC filter) is disclosed. The LLC filter may connect the transmission RF mixer 610 and the transmission DA 615 of FIG. 4 to each other.

In more detail, the LLC filter may be connected between a first node input to an end of the transmission DA 615 and a second node input to another end of the transmission DA 615. For example, the LLC filter may correspond to (e.g., include, be, etc.) a shunt impedance matching network.

According to embodiments, a transfer function of a circuit viewed from the transmission RF mixer 610 toward the transmission DA 615 is calculated as follows.

$$H(s) = \frac{s(L_1 + L_2)(1 + s^2(L_1 \| L_2)C_1)}{1 + s^2(L_1 C_1 + C_{DA}(L_1 + L_2)) + s^4(L_1 L_2 C_1 C_{DA})} \quad \text{[Equation 1]}$$

where $C_{DA}$ indicates a parasitic capacitance value generated by the transmission DA 615.

According to embodiments, when the numerator of the transfer function is 0, load impedance viewed from the transmission RF mixer 610 is 0 (or low impedance). In other words, an RF signal of a frequency that renders the transfer function to low impedance may be rejected through alternating current ground (AC GND) connected to an inductor $L_1$ of FIG. 5. According to embodiments, the AC GND (also referred to herein as ground) may be included in (e.g., connected to) the middle of the inductor $L_1$ as depicted in FIG. 5. According to embodiments, assuming that a 3rd harmonic of an operating frequency renders the transfer function to 0, the operating frequency of the 3rd harmonic is as follows.

$$w_{3flo} = \frac{1}{\sqrt{(L_1 \| L_2)C_1}} \quad \text{[Equation 2]}$$

According to embodiments, when the denominator of the transfer function is 0, load impedance viewed from the transmission RF mixer 610 is ∞ or high impedance). In other words, an RF signal of a frequency that renders the denominator of the transfer function into 0 may apply high impedance of the transmission DA 615. According to embodiments, when an RF signal of an operating frequency renders the denominator of the transfer function to 0, the operating frequency is as follows.

$$w_{fund} = \frac{1}{\sqrt{L_1 C_1 + C_{DA}(L_1 + L_2)}} \quad \text{[Equation 3]}$$

According to embodiments, a variable capacitance $C_1$ may change a capacitance value, based on a control signal received from the communication processor 400. Because a $C_{DA}$ value based on the transmission DA 615 may have a pre-determined or alternatively, given value, the communication processor 400 may control the variable capacitance $C_1$ to have the same capacitance value as, or a similar capacitance value to, the measured $C_{DA}$ value.

According to embodiments, the $3^{rd}$ harmonic of Equation 2 may have a multiple relationship with the operating frequency of Equation 3. Accordingly, the multiple relationship may be expressed as follows.

$$\frac{w_{3flo}}{w_{fund}} = \frac{\sqrt{2L_1 + L_2}}{\sqrt{L_1 \| L_2}} = 3 \quad \text{[Equation 4]}$$

According to embodiments, when $L_1$ and $L_2$ satisfy Equation 4, an RF signal of a 3rd harmonic may be rejected through AC GND, and at the same time (or contemporaneously) an RF signal of an operating frequency may transmit a high output based on high impedance to the transmission DA 615. According to embodiments, an inductance ratio between $L_1$ and $L_2$ may be determined to satisfy Equation 4, and be determined based on the operating frequency and the $3^{rd}$ harmonic signal.

According to embodiments, the capacitance value $C_1$ of may be set to have a multiple relationship with the parasitic capacitance $C_{DA}$ of the transmission DA 615. For example, to cover up to an RF signal of a super-high frequency band, the inductance values of $L_1$ and $L_2$ may be within a limited range. Inductance values of $L_1$ and $L_2$ satisfying Equation 4 for rejecting a 3rd harmonic RF signal may deviate from the limited range. In other words, when the capacitance value of $C_1$ and the parasitic capacitance $C_{DA}$ are set to be the same (or similar), inductors $L_1$ and $L_2$ that may be arranged (e.g., inductors $L_1$ and L2 satisfying Equation 4) may not exist. For example, the capacitance value of $C_1$ may be adjusted to be half of the parasitic capacitance $C_{DA}$. In this case, as long as the inductance values of $L_1$ and $L_2$ satisfy the following condition, the 3rd harmonic RF signal may be rejected, and also an operating frequency RF signal may be transmitted to the transmission DA 615 with a high gain.

$$\frac{w_{3flo}}{w_{fund}} = \frac{\sqrt{3L_1 + 2L_2}}{\sqrt{L_1 \| L_2}} = 3 \quad \text{[Equation 5]}$$

In the above-described example, a relational expression used by the passive mixer circuit to provide low impedance for the 3rd harmonic RF signal is shown. However, embodiments of the inventive concepts are not limited thereto. According to embodiments, when the passive mixer circuit adjusts an inductance ratio between $L_1$ and $L_2$ to satisfy the following relational expression in order to provide low impedance for an n-th harmonic RF signal, the n-th harmonic RF signal may be rejected, and also high impedance may be provided for an operating frequency. According to embodiments, the inductance ratio is determined based on the n-th harmonic signal of a frequency corresponding to n times the operating frequency. According to embodiments, 'n' is an odd number (e.g., 3).

$$\frac{w_{nflo}}{w_{fund}} = \frac{\sqrt{2L_1 + L_2}}{\sqrt{L_1 \| L_2}} = n \quad \text{[Equation 6]}$$

Figure 6:
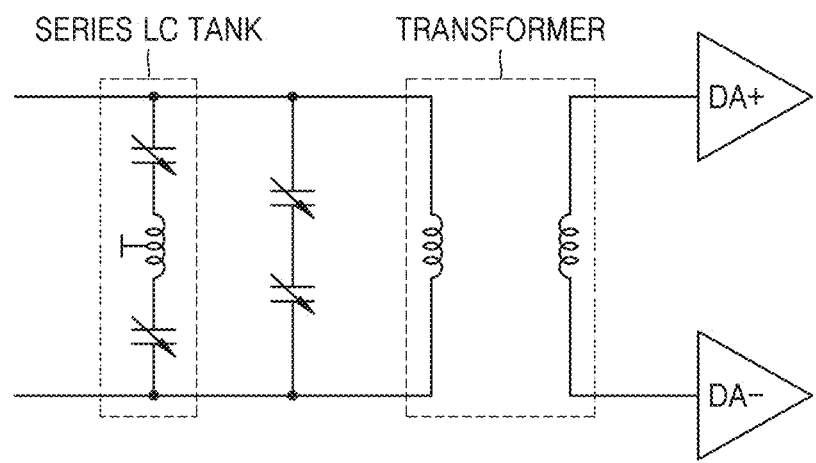
FIG. 6 is a circuit diagram of a notch mixer circuit according to a first comparative example.

FIG. 6 is a circuit diagram of a passive mixer circuit according to a first comparative example.

Referring to FIG. 6, a passive mixer circuit including a transformer, four variable capacitors, and an inductor is illustrated.

The passive mixer circuit may be referred to as a notch mixer. In a notch mixer circuit, an open (e.g., provides high impedance) circuit may be formed at the operating frequency by using a transformer, and a short (e.g., provides low impedance) circuit may be provided at the 3rd harmonic. However, when minute adjustment of the inductor is impossible or difficult, it is impossible (or difficult) to reject the 3rd harmonic RF signal with only one variable capacitor. Accordingly, as shown in FIG. 6, the notch mixer circuit uses four variable capacitors to reject a 3rd harmonic signal and also provide high impedance at an operating frequency. However, a notch mixer circuit including four variable capacitors may not be miniaturized. In addition, a reactance component generated by a plurality of variable capacitors may decrease resistance impedance and result in higher current consumption in baseband signal processing.

For example, to support 5G communication, an operating frequency that the transmission RF chain 601 supports is in the range of 5.925 GHz to 7.125 GHz. When the notch mixer circuit is used, the plurality of variable capacitors (for example, 4 variable capacitors in the case of FIG. 6) are used, and thus an RF filter between the transmission RF mixer 610 and the transmission DA 615 may have a low Q-factor, and may provide a low 3rd harmonic rejection ratio and low impedance at the operating frequency.

Figure 7:
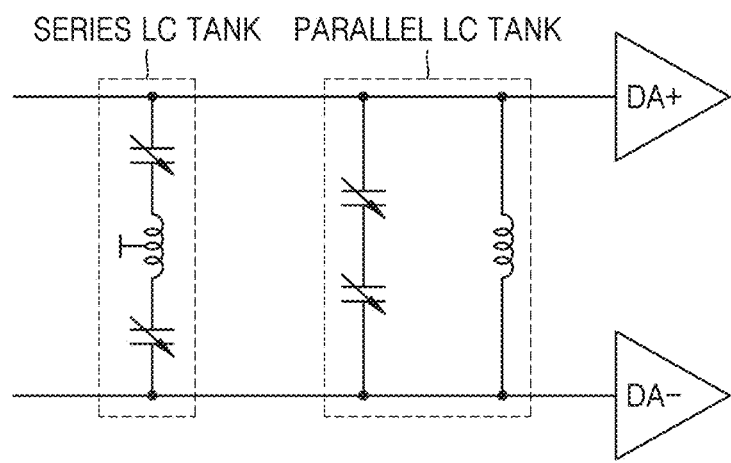
FIG. 7 is a circuit diagram of a notch mixer circuit according to a second comparative example.

FIG. 7 is a circuit diagram of a passive mixer circuit according to a second comparative example.

Referring to FIG. 7, a passive mixer circuit including a series LC tank and a parallel LC tank is illustrated. A notch mixer circuit of FIG. 7 may further include the parallel LC tank without including a transformer. In more detail, an inductor in the parallel LC tank may constitute a transformer and an equivalent circuit.

Similar to FIG. 6, the series LC tank may be set with an inductance value and a capacitance value that short-circuit at the frequency of a 3rd harmonic. In other words, the 3rd harmonic RF signal may be rejected through AC GND. The inductance value and the capacitance value may be previously set so that the parallel LC tank becomes an open circuit and an equivalent circuit when an RF signal of an operating frequency is applied. When the operating frequency is changed, the capacitance values of the two variable capacitors in the parallel LC tank may be adjusted. However, it may be confirmed that four variable capacitors exist to form a short circuit of the series LC tank at a 3rd harmonic RF signal and form an open circuit of the parallel LC tank at an operating frequency RF signal. Because power consumption by a capacitor increases with an increase in a frequency band, it would be desirable for the number of variable capacitors to be smaller.

It would be desirable for the output power of the notch mixer circuit to be small in order to reduce values representing linearity, such as an Adjacent Channel Leakage Ratio (ACLR) and an Error Vector Magnitude (EVM). However, as the output power of the notch mixer circuit decreases, a gain of the transmission DA 615 is set to be large, and in this case, additional power consumption of the transmission DA 615 may be caused.

Figure 8:
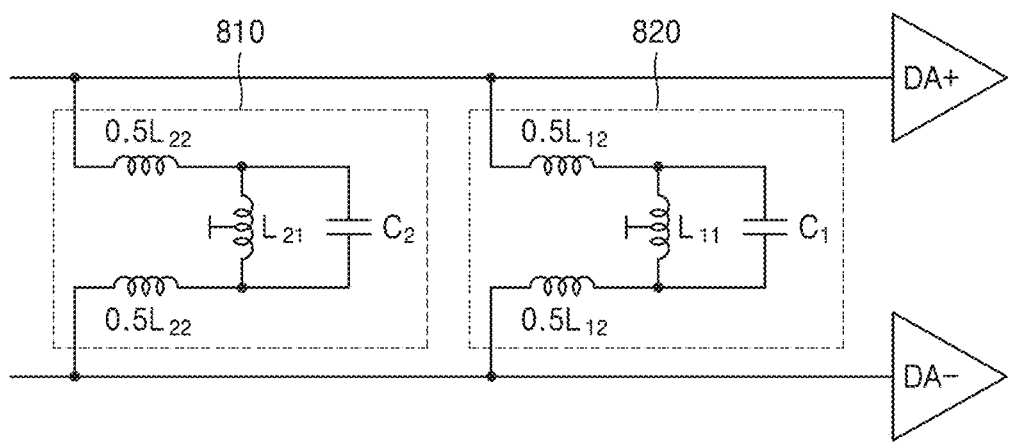
FIG. 8 is a circuit diagram of a passive mixer circuit including parallel matching networks according to embodiments of the inventive concepts.

FIG. 8 is a circuit diagram of a passive mixer circuit according to embodiments of the inventive concepts.

Referring to FIG. 8, the passive mixer circuit may include a first matching network 810 and a second matching network 820. The first matching network 810 may be connected to the second matching network 820 in parallel. Each of the first matching network 810 and the second matching network 820 may include the LLC filter of FIG. 5.

According to embodiments, the first matching network 810 and the second matching network 820 may reject different frequencies. For example, the first matching network 810 may correspond to an LLC filter circuit for rejecting a 3rd harmonic, and the second matching network 820 may correspond to an LLC filter circuit for rejecting a $5^{th}$ harmonic.

In the above-described example, the passive mixer circuit includes two matching networks, namely, the single first matching network 810 and the single second matching network 820. However, embodiments of the inventive concepts are not limited thereto. According to embodiments, m matching networks may be connected in parallel in order to reject m harmonics (where 'm' is an integer greater than 2).

Figure 9:
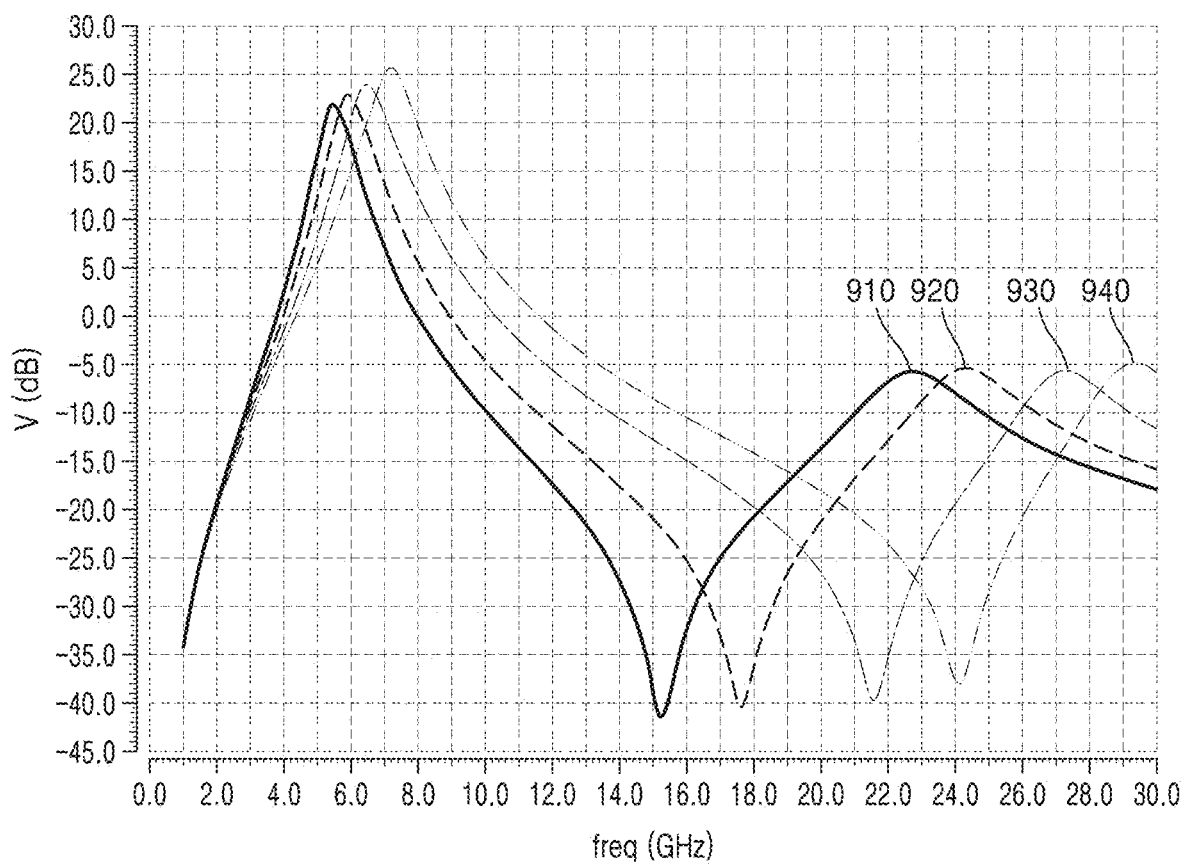
FIG. 9 is a graph showing an improvement in a 3rd harmonic rejection ratio of a passive mixer circuit according to embodiments of the inventive concepts.

FIG. 9 is a graph showing an improvement in a 3rd harmonic rejection ratio of a passive mixer circuit according to embodiments of the inventive concepts.

FIG. 9 illustrates a 3rd harmonic rejection ratio according to sweeping the capacitance value of the capacitor $C_1$.

According to embodiments, a first plot 910 shows an output impedance (e.g., the output impedance of the LLC filter) versus a frequency when the capacitance value of the variable capacitor $C_1$ is 2pF . For example, when the capacitance value of $C_1$ is 2pF, the operating frequency is 5.48 GHz, and an output impedance at the operating frequency is 21.6318dB. When the capacitance value of $C_1$ is 2pF, the frequency of a 3rd harmonic (e.g., triple the operating frequency) is 15.3 GHz, and the output impedance at the 3rd harmonic is—41.2581dB. In other words, when the capacitance value of $C_1$ is 2pF, the 3rd harmonic rejection ratio is 62.8899dB. According to embodiments, the output impedance of the LLC filter has a maximum (or highest) value at the operating frequency and a minimum (or lowest) value at a frequency that is triple the operating frequency. According to embodiments, the output impedance of the LLC filter includes only a resistance component of a real number (e.g., without a reactance component).

According to embodiments, a second plot 920 shows an output impedance versus a frequency when the capacitance value of the variable capacitor $C_1$ is 1.5pF. For example, when the capacitance value of $C_1$ is 1.5pF, the operating frequency is 5.94 GHz , and an output impedance at the operating frequency is 22.6247dB. When the capacitance value of $C_1$ is 1.5pF, the frequency of a 3rd harmonic is 17.68 GHz, and the output impedance at the 3rd harmonic is—40.383dB. In other words, when the capacitance value of $C_1$ is 1.5pF, the 3rd harmonic rejection ratio is 63.0077dB.

According to embodiments, a third plot 930 shows an output impedance versus a frequency when the capacitance value of the variable capacitor $C_1$ is 1pF. For example, when the capacitance value of $C_1$ is 1pF, the operating frequency is 6.46 GHz, and an output impedance at the operating frequency is 23.8312dB . When the capacitance value of $C_1$ is 1pF, the frequency of a 3rd harmonic is 21.6 GHz, and the output impedance at the 3rd harmonic is—39.5775dB. In other words, when the capacitance value of $C_1$ is 1pF, the 3rd harmonic rejection ratio is 63.4087dB.

According to embodiments, a fourth plot 940 shows an output impedance versus a frequency when the capacitance value of the variable capacitor $C_1$ is 0.8pF. For example, when the capacitance value of $C_1$ is 0.8pF, the operating frequency is 7.2 GHz , and an output impedance at the operating frequency is 25.4309dB . When the capacitance value of $C_1$ is 0.8pF, the frequency of a 3rd harmonic is 24.16 GHz, and the output impedance at the 3rd harmonic is—37.8658dB . In other words, when the capacitance value of $C_1$ is 0.8pF, the 3rd harmonic rejection ratio is 63.2967dB.

In other words, it may be seen that, even when the passive mixer circuit including an LLC filter according to embodiments of the inventive concepts uses one variable capacitor, the passive mixer circuit has a high impedance at an operating frequency and also has a low impedance at a $3^{rd}$ harmonic. For example, existing notch mixer circuits have a 3rd harmonic rejection ratio of about 20 to about 30 dB, whereas the passive mixer circuit including the LLC filter may have a 3rd harmonic rejection ratio of about 62 to about 63 dB.

Figure 10:
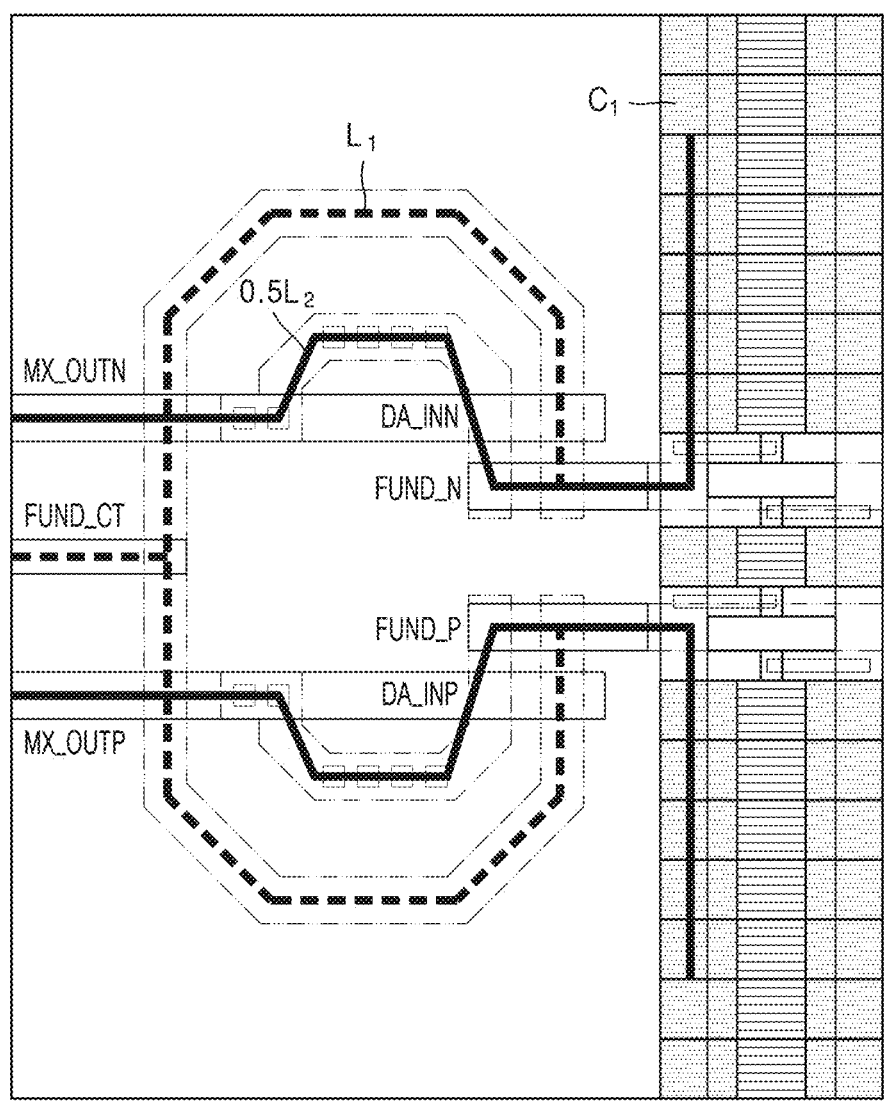
FIG. 10 is a layout of a passive mixer circuit according to embodiments of the inventive concepts.

FIG. 10 shows a layout of a passive mixer circuit according to embodiments of the inventive concepts.

Referring to FIG. 10, a node that connects MX_OUTN through DA_INN may correspond to a first node. MX_OUTN corresponds to one end from among differential output ends of the transmission RF mixer 610, and DA_INN corresponds to one end from among differential input ends of the transmission DA 615. A node that connects MX_OUTP through DA_INP may correspond to a second node. MX_OUTP corresponds to the other end from among the differential output ends of the transmission RF mixer 610, and DA_INP corresponds to the other end from among the differential input ends of the transmission DA 615.

The right side of the layout may correspond to a plurality of cap-arrays. The capacitance value may be variably adjusted by turning on/off at least some of the plurality of cap-arrays according to the control signal received from the communication processor 400. A Connection between MX_OUTN and the plurality of cap-arrays may each correspond to $0.5L_2$. FUND_CT may correspond to AC GND of FIG. 5, and a connection to $0.5L_2$ on the basis of vertical symmetry with FUND_CT may correspond to $L_1$. Referring to FIGS. 5 through 7, because the passive mixer circuit including the LLC filter according to embodiments of the inventive concepts is implemented according to a layout including a single capacitor, the passive mixer circuit may implement an LLC filter having a high 3rd harmonic rejection ratio in a smaller area, compared with the passive mixer circuit including the four variable capacitors discussed in connection with the comparative examples of FIGS. 6 and 7.

Conventional passive mixer circuits for harmonic rejection operate by using a plurality of capacitors. Accordingly, the conventional passive mixer circuits have an excessively large physical size. Also, a reactance component generated by the plurality of capacitors decreases resistance impedance and reduces channel flatness, resulting in excessive current consumption during broadband signal processing and insufficient wide bandwidth support.

However, according to embodiments, improved passive mixer circuits are provided. For example, the improved passive mixer circuits operate using a ratio of inductors to provide a high $3^{rd}$ harmonic rejection ratio and high impedance at an operating frequency. The improved passive mixer circuits are able to operate using only one variable capacitor, and as a result an output impedance of the improved passive mixer circuits includes only a resistance component without a reactance component. Thus, the improved passive mixer circuits overcome the deficiencies of the conventional passive mixer circuits to reduce the physical size of the passive mixer circuits, reduce current consumption during broadband signal processing, and/or increase channel flatness to support a wider bandwidth.

According to embodiments, operations described herein as being performed by the base station 110, the electronic device 120, the wireless communication interface 210, the backhaul communication interface 220, the controller 240, communication interface 310, the controller 330, the transmission RF chain, the communication processor 400, the IF IC 500, the RF IC 600, the DAC 410, the ADS 420, the modem, the transmission IF chain 501, the reception IF chain 502, the first transmission VGA 515, the LPF 520, the second transmission VGA 525, the transmission IF mixer 530, the first reception VGA 550, the LPF 545, the second reception VGA 540, the reception IF mixer 535, the transmission RF chain 601, the reception RF chain 602, the transmission RF mixer 610, the transmission DA 615, the phase shifter 620, the transmission PA 625, the reception RF mixer 645, the reception DA 640, the phase shifter 635, and/or the reception PA 630 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The various operations of methods described above may be performed by any suitable device capable of performing the operations, such as the processing circuitry discussed above. For example, as discussed above, the operations of methods described above may be performed by various hardware and/or software implemented in some form of hardware (e.g., processor, ASIC, etc.).

The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or operations of a method or algorithm and functions described in connection with embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium (e.g., the storage 230, the storage 320, the transmission IF buffer 510, and/or the reception IF buffer 555). A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

While the inventive concepts have been particularly shown and described with reference to embodiments thereof, it will be understood that various changes in form and details may be made therein without departing from the spirit and scope of the following claims.

What is claimed is:

1. A transmission radio frequency (RF) circuit comprising:
  a transmission mixer configured to receive an intermediate frequency (IF) signal and up-convert the IF signal into an RF signal;

a driving amplifier configured to amplify the RF signal;
an LLC filter electrically connected to a differential output of the transmission mixer and a differential input of the driving amplifier, the LLC filter comprising,
   a first inductor connecting a first node of the differential output of the transmission mixer to a first intermediate node,
   a second inductor connecting a second node of the differential output of the transmission mixer to a second intermediate node,
   a third inductor connecting the first intermediate node to the second intermediate node, and
   a capacitor in parallel with the third inductor; and
processing circuitry configured to adjust a capacitance value of the capacitor based on a capacitance value of the driving amplifier.

2. The transmission RF circuit of claim 1, wherein the processing circuitry is configured to adjust the capacitance value of the capacitor based on the capacitance value of the driving amplifier and an operating frequency.

3. The transmission RF circuit of claim 1, wherein the first inductor and the second inductor have a first inductance value.

4. The transmission RF circuit of claim 3, wherein
the third inductor has a second inductance value; and
the first inductance value and the second inductance value are set according to a ratio.

5. The transmission RF circuit of claim 4, wherein the ratio is based on an n-th harmonic signal of a frequency corresponding to n times an operating frequency.

6. The transmission RF circuit of claim 5, wherein an output impedance of the LLC filter has a maximum value at the operating frequency and a minimum value at a frequency that is triple the operating frequency.

7. The transmission RF circuit of claim 6, wherein the output impedance of the LLC filter comprises only a resistance component of a real number.

8. The transmission RF circuit of claim 4, wherein the ratio is based on
an operating frequency and a 3$^{rd}$ harmonic signal; and
an equation below $$\frac{\sqrt{2L_1 + L_2}}{\sqrt{L_1 \| L_2}} = 3$$

L$_1$ being the first inductance value and L$_2$ being the second inductance value.

9. The transmission RF circuit of claim 5, wherein n is an odd number.

10. The transmission RF circuit of claim 1, wherein the first inductor and the second inductor have a first inductance value;
the third inductor has a second inductance value; and
the first inductance value and the second inductance value are based on the following equation:

$$\frac{\sqrt{xL_1 + yL_2}}{\sqrt{L_1 \| L_2}} = n$$

L$_1$ being the first inductance value, L$_2$ being the second inductance value, x and y being integers, and n being an odd number.

11. An LLC filter comprising:
a first inductor connecting a first node of a differential output end of a radio frequency (RF) mixer to a first intermediate node;
a second inductor connecting a second node of the differential output end of the RF mixer to a second intermediate node, the first inductor and the second inductor having a first inductance value;
a third inductor connecting the first intermediate node to the second intermediate node, a middle of the third inductor being connected to ground, and the third inductor having a second inductance value; and
a capacitor in parallel with the third inductor,
wherein the first inductance value and the second inductance value are based on the following equation:

$$\frac{\sqrt{xL_1 + yL_2}}{\sqrt{L_1 \| L_2}} = n$$

L$_1$ being the first inductance value, L$_2$ being the second inductance value, x and y being integers, and n being an odd number.

12. The LLC filter of claim 11, wherein a capacitance value of the capacitor is based on an operating frequency.

13. The LLC filter of claim 12, wherein the first inductance value and the second inductance value are set based on an n-th harmonic signal of a frequency corresponding to n times the operating frequency.

14. The LLC filter of claim 13, wherein an output impedance of the LLC filter has a maximum value at the operating frequency and a minimum value at a frequency that is triple the operating frequency.

15. The LLC filter of claim 14, wherein the output impedance of the LLC filter comprises only a resistance component of a real number.

16. The LLC filter of claim 12, wherein the first inductance value and the second inductance value are based on the operating frequency and a 3$^{rd}$ harmonic signal; and
an equation below $$\frac{\sqrt{2L_1 + L_2}}{\sqrt{L_1 \| L_2}} = 3$$

L$_1$ being the first inductance value and L$_2$ being the second inductance value.

17. An electronic device comprising:
a controller; and
a communication interface comprising,
   a converter configured to convert a baseband signal into an analog signal,
   a first mixer configured to convert the analog signal into an intermediate frequency (IF) signal based on a first oscillation frequency,
   a second mixer configured to convert the IF signal into a radio frequency (RF) signal based on a second oscillation frequency to obtain an output signal,
   an RF filter configured to filter the output signal to obtain a filtered output signal, and
   a driving amplifier configured to amplify the filtered output signal, wherein the RF filter comprises,
      a first inductor connecting a first node of a differential output end of the second mixer to a first intermediate node, a second inductor connecting a second node of the differential output end of the second mixer to a second intermediate node,
a third inductor connecting the first intermediate node to the second intermediate node, and
a capacitor in parallel with the third inductor; and
processing circuitry configured to adjust a capacitance value of the capacitor based on a capacitance value of the driving amplifier.

18. The electronic device of claim 17, wherein
the controller is configured to transmit a control signal to the communication interface, the control signal adjusting a capacitance value of the capacitor based on the capacitance value of the driving amplifier and an operating frequency;
the first inductor and the second inductor have a first inductance value;
the third inductor has a second inductance value; and
the first inductance value and the second inductance value are set according to a ratio.

19. The electronic device of claim 18, wherein the ratio is based on
the operating frequency and a $3^{rd}$ harmonic signal; and
an equation below $$\frac{\sqrt{2L_1 + L_2}}{\sqrt{L_1 \| L_2}} = 3$$

$L_1$ being the first inductance value and $L_2$ being the second inductance value.

20. The electronic device of claim 19, wherein an output impedance of the RF filter has a maximum value at the operating frequency and has a minimum value at a frequency that is triple the operating frequency, the output impedance of the RF filter comprising only a resistance component of a real number.

* * * * *